(12) United States Patent
Martens et al.

(10) Patent No.: US 10,225,073 B1
(45) Date of Patent: Mar. 5, 2019

(54) SYSTEM AND METHOD FOR CONTINUOUS ACQUISITION OF DATA DURING FREQUENCY AND POWER SWEEPS WITH COHERENT MEASUREMENT

(71) Applicant: ANRITSU COMPANY, Morgan Hill, CA (US)

(72) Inventors: Jon S. Martens, San Jose, CA (US); Elena Vayner, San Jose, CA (US); Jamie Tu, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 181 days.

(21) Appl. No.: 15/442,415

(22) Filed: Feb. 24, 2017

Related U.S. Application Data

(60) Provisional application No. 62/300,250, filed on Feb. 26, 2016.

(51) Int. Cl.
*G01R 27/28* (2006.01)
*H04L 7/033* (2006.01)
*H04L 12/26* (2006.01)
*G01R 31/00* (2006.01)

(52) U.S. Cl.
CPC .............. *H04L 7/033* (2013.01); *G01R 27/28* (2013.01); *H04L 43/50* (2013.01); *G01R 31/001* (2013.01)

(58) Field of Classification Search
CPC ... H04L 7/00; H04L 7/02; H04L 7/033; H04L 43/00; H04L 43/50; G01R 31/00; G01R 31/001; G01R 31/002; G01R 31/08; G01R 31/10; G01R 31/11; G01R 31/28; G01R 31/2822; G01R 31/31708; G01R 27/00; G01R 27/28; G01R 23/00; G01R 23/16; G01R 19/00; G01R 19/2506; G01R 11/00; G01R 13/00; G01R 21/00; G01R 22/00; G01R 25/00; G01R 29/00; G01R 33/00
USPC ....... 324/500, 512, 522, 523, 527, 528, 532, 324/535, 537, 76.11, 76.12, 76.19, 76.22; 702/1, 57, 66
See application file for complete search history.

(56) References Cited

U.S. PATENT DOCUMENTS

| 7,271,575 B2 * | 9/2007 | Pickerd ................. G01R 13/22 324/642 |
| 9,606,212 B1 * | 3/2017 | Martens ................. G01R 27/32 |
| 9,874,600 B2 * | 1/2018 | Yehle .................. G01R 31/2834 |
| 2007/0236230 A1 * | 10/2007 | Tanbakuchi ........... G01R 27/28 324/650 |

(Continued)

*Primary Examiner* — Hoai-An D. Nguyen
(74) *Attorney, Agent, or Firm* — Tucker Ellis LLP

(57) ABSTRACT

A system for obtaining measurements for a device under test (DUT) includes a vector network analyzer including a storage medium and a controller for controlling a sweep and a trigger driver configured to provide a synchronization signal to the DUT and the controller to synchronize internal signal components of the vector network analyzer including signal sources, local oscillators (LOs) and an analog-to-digital converter (ADC) clock. A signal is received by the vector network analyzer in response to a test signal generated and transmitted to the DUT. Data related to the received signal is acquired and stored in at the storage medium. The controller inserts a mark into the time record based on an event of the sweep for identifying data from the received signal associated with the event within the time record.

20 Claims, 8 Drawing Sheets

(56) References Cited

U.S. PATENT DOCUMENTS

| | | | | |
|---|---|---|---|---|
| 2011/0279275 | A1* | 11/2011 | Horng | A61B 5/0205 |
| | | | | 340/573.1 |
| 2012/0268101 | A1* | 10/2012 | Weller | G01R 13/0218 |
| | | | | 324/76.11 |
| 2016/0202299 | A1* | 7/2016 | Zaostrovnykh | G01R 27/28 |
| | | | | 702/108 |
| 2017/0307678 | A1* | 10/2017 | Diegmann | G01R 31/2808 |
| 2017/0331179 | A1* | 11/2017 | Froitzheim | H03K 17/13 |

* cited by examiner

SYSTEM AND METHOD FOR CONTINUOUS ACQUISITION OF DATA DURING FREQUENCY AND POWER SWEEPS WITH COHERENT MEASUREMENT

CLAIM OF PRIORITY

This application claims the benefit of priority to U.S. Provisional Application titled "CONTINUOUS DIGITIZER ACQUISITION DURING FREQUENCY AND POWER SWEEPS FOR COHERENT MEASUREMENT", Application No. 62/300,250, filed Feb. 26, 2016, which application is herein incorporated by reference.

TECHNICAL FIELD

The present invention relates generally to methods and instruments for measuring the electrical behavior of electrical devices, electrical networks and components thereof.

BACKGROUND

There are certain applications where continuity of acquisition during a measurement process has importance for either temporal (as in transient data collection) or phase (as in phase variation or clock recovery) coherence. In the temporal case, there are examples of pulse measurements of a device under test (DUT) where it can be desirable to acquire pulse response at a series of frequencies or powers (e.g., a countable number per pulse or a countable number of pulses per step), but no pulses can be skipped in order to collect the transient response of the DUT. Such examples include high power radar systems for air traffic control or electronic surveillance or other application where a system must be very quickly turned on or turned to a specific target. There is a need to understand how a transmitter is acting in the first few time increments after it is turned it. In such higher power scenarios thermalisation and other transients are more likely to occur and cause problems.

Currently some systems use pure time domain acquisition and sort through the data record for the relevant parts, but the base dynamic range can be limited, corrections for match and other defects difficult, and identification of the points of interest complicated. Further, the allowed sweep speed may be quite limited because of triggering complexities and if both sweep and acquisition are not carefully controlled the DUT can be exposed to energy that is not characterized or information can be lost.

In the phase coherence category, one application is that of embedded local oscillator (LO) measurements. Measuring the phase response or group delay of a frequency converter when the LO of a DUT is not precisely known has been a difficult problem for decades. Some solutions involve a modulated stimulus, such as narrow-band frequency modulation (NBFM) or double-sideband suppressed-carrier transmission (DSBSC) amplitude modulation (AM), where the phase relationship between the sidebands of modulation is used to deduce the phase of the output signal. These methods often suffer from poor phase resolution. Other techniques involve a phase-locking/phase-hunting method on the measurement receiver to follow the DUT output frequency. These methods often can only handle a fairly small DUT frequency error and are prone to losing the phase reference as the drift rate changes even by a small amount.

SUMMARY

In accordance with an embodiment, a system and method for obtaining measurements for a device under test (DUT) includes a vector network analyzer including a storage medium and a controller for controlling a sweep and a trigger driver configured to provide a synchronization signal to the DUT and the controller to synchronize internal signal components of the vector network analyzer including signal sources, local oscillators (LOs) and an analog-to-digital converter (ADC) clock. A signal is received by the vector network analyzer in response to a test signal generated and transmitted to the DUT. Data related to the received signal is acquired and stored in at the storage medium. The controller inserts a mark into the time record based on an event of the sweep for identifying data from the received signal associated with the event within the time record.

In accordance with a further embodiment, the trigger driver is external to the vector network analyzer and the synchronization signal is provided to the vector network analyzer. The trigger driver can be associated with the DUT and activates or otherwise initiates an action of the DUT. Alternatively the trigger driver can be a component of the vector network analyzer.

In accordance within an embodiment, synchronizing internal components of vector network analyzer and the DUT, includes synchronizing, via the controller, signals sources, LOs, and an ADC clock of the vector network analyzer includes adjusting timing based on the synchronization signal and latencies to each of the internal components and to the DUT.

In accordance with an embodiment, the controller is configured to initiate and perform a sweep of frequency or power independent of data acquisition and wherein the data is acquired continuously and for each step of the sweep. The controller can insert the mark into the time record based on a change in step in the sweep for identifying the change in step within the time record. Where the test signal is a pulsed test signal, each step in the sweep can correspond to an integer number of pulses of the pulsed test signal.

BRIEF DESCRIPTION OF THE DRAWINGS

Further details of the present invention are explained with the help of the attached drawings in which.

DETAILED DESCRIPTION

Figure 1:
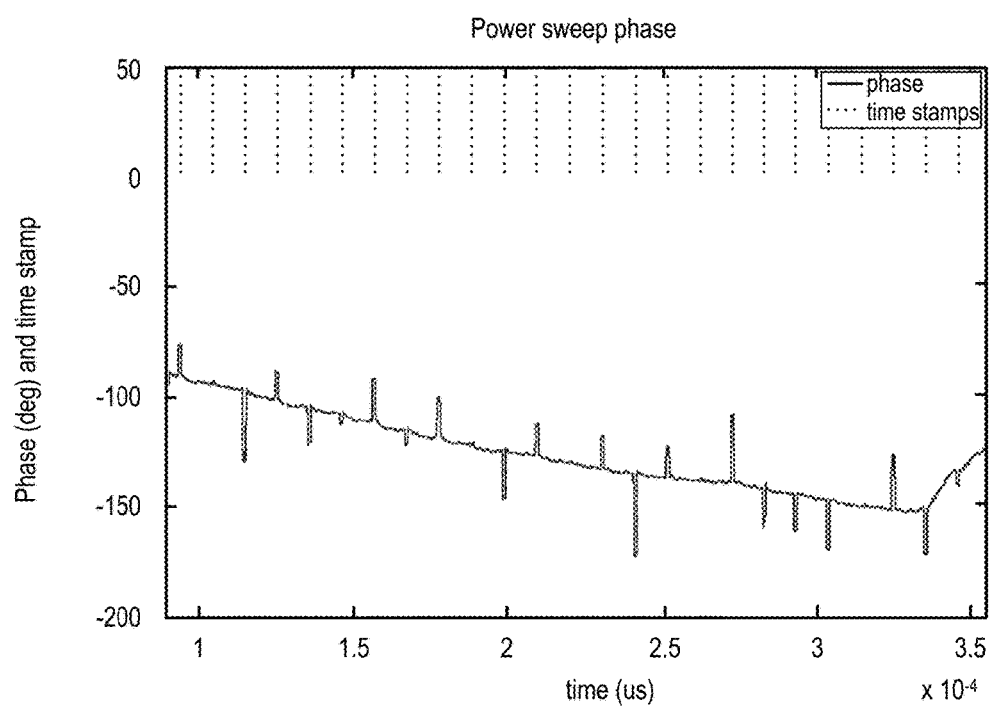
FIG. 1 illustrates a plot for a power sweep of a potentially nonlinear converter whose timebase is isolated.

The following description is of the best modes presently contemplated for practicing various embodiments of the present invention. The description is not to be taken in a limiting sense but is made merely for the purpose of describing the general principles of the invention. The scope of the invention should be ascertained with reference to the claims. Numerous specific details are set forth to provide a thorough description of the invention. However, it will be apparent to those skilled in the art that the invention may be practiced without these specific details. In other instances, well-known features have not been described in detail so as not to obscure the invention. More particularly, embodiments are described throughout the description that reference use of a vector network analyzer (VNA). However, in other embodiments, systems and methods in accordance with the invention are useable with other measurement instruments, and the invention should not be construed as being limited to use with a VNA.

Performance and modeling demands have increased the need for coherent quasi-linear network analyzer measurements of a variety of devices at both microwave and millimeter (mm)-wave frequency ranges. Coherence can refer to the ability to retain phase information on a given quantity during the sweep when simple ratioing may be difficult (e.g., harmonic and intermodulation measurements). Existing techniques for calibration of phase information do not lend themselves to easily maintaining repeatable phase information at all on these types of quantities during a fast sweep. Existing techniques include the use of a nonlinear generator of some kind in the reference path of a vector network analyzer (VNA), certain higher-order statistical techniques, the use of a pilot signal generator (e.g., a waveform generator feeding a reference path or feeding the main detection path at an offset frequency) among others. While these approaches provide solutions, they often require added hardware, can reduce measurement throughput and can have their own signal-to-noise issues (particularly for higher-order nonlinearities) that may limit measurement capabilities.

A further problem is that of more global time coherence where a DUT state variable (e.g., bias or a control signal) or the phase of a modulating signal must be aligned both with the sweep and with the acquisition. As modulation bandwidths increase, these timing requirements are sometimes not far from basic phase timing needs. While various triggering solutions exist for this class of concerns, speed and the ability to handle rapid transitions have sometimes been issues. Monitoring transients on sweeps of this kind is of some interest in analyzing thermal and trapping responses and synchronizing the modulation, state variables, and the measurement can be useful.

Systems and methods in accordance with embodiments can apply a wideband and a deep-memory digitizer to address both problem types. Internal synchronization approaches can offer a simpler approach to this problem. Of interest is in when the source and/or receiver are sweeping (in terms of frequency and/or power), and information about the synthesizer behavior is used in order to establish both phase and time coherence. The use of a time record to keep phase information coherent is the basis of time domain measurements in general. Systems and methods can apply techniques for marking time record measurements with synthesizer information and using synthesizer synchronization to align the phase information in the time record without the use of another reference signal but maintaining timing between all of the relevant variables. Such a structure can enable somewhat simpler and faster measurements covering a variety of categories.

Systems and methods in accordance with embodiments can be applied to improve the functionality of VNA measurements by allowing continuous acquisition of multiple channels of wideband data while frequency and/or power are swept. By synchronizing relevant sources/local oscillators (LOs) and the analog-to-digital converter (ADC) clock and marking the time record with sweep information, both temporal and phase coherence can be better maintained while sweeping at high speeds.

A system and method in accordance with embodiments can be applied for continuously acquiring VNA or measuring receiver complex data on one or more channels during a frequency, power or other kind of sweep while maintaining time and phase coherence. This capability, arising from a combination of clock synchronization, event data marking, and flexible acquisition rates and lengths helps a number of measurement applications where DUT behavior related to transitions between sweep steps (at the same frequency or different frequencies) may be of interest.

Systems and methods in accordance with embodiments can use temporal and phase coherent continuous acquisition during a sweep, synchronized receiver and acquisition, time marked sweep sequence, long time record acquisition to track DUT phase evolution and allow more complex analysis, embedded LO mixer/converter phase/group delay measurements with non-negligible frequency variance, and time harmonic waveform reconstruction and extended modulated scattering (S-) parameter measurements Systems and methods in accordance with embodiments can apply a long time record digitizer with sufficient resolution to capture events of interest. This can benefit from deep memory and a flexible acquisition rate.

Systems and methods in accordance with embodiments can also apply a fast sweep engine and some way of marking the data stream when a new point (frequency or power) has been reached. For example, where a bit goes high to indicate that the new point is locked and this is routed to a running bit position in the data flow so it can be identified in post-processing. Since the acquisition rate can be high, from 100 s of mega-samples per second (MSPS) to giga-samples per second (GSPS), this must usually be done in hardware.

Systems and methods in accordance with embodiments can provide triggering the overall measurement process so it can be synchronized to external events (such as activating the DUT so that turn-on transients can be captured). In an embodiment, this can be done by linking an external trigger path to the sweep engine but not directing data acquisition directly.

Systems and methods in accordance with embodiments can provide a means of synchronizing the ADC clock with the data. This has two parts: (1) since the sweep events may be aperiodic, the point-to-point time deltas are normalized out, (2) at least the LO and the ADC clock is phase coherent (i.e., absolute phase starting from 0 at the same time; in some cases the DUT stimulus is also coherent) which can be accomplished in a number of ways including synchronous direct digital synthesizer (DDS) resets.

Referring to FIG. 1, a power sweep of a potentially nonlinear converter whose timebase is isolated is illustrated. The input power is swept over a 20 dB range and the data recorded during the sweep using the above process. The time stamps (corresponding to each power point in the sweep) are marked in the data stream and plotted with spikes in the plot. The phase data is envelope processed and time aligned for the processing time misalignments. The intermediate phase data is plotted. The spikes in that data come from when the sweep leveling system is unsettled and those would normally be stripped off. The DUT's internal time base was off by slightly less than 7 Hz (multiplied up to the operating frequency) which results in the slope at earlier time slots . . . this would be rotated out in some applications. Finally, there is an up-turn in phase at higher power levels (starting at about 34000 μs in the plot) where the DUT is starting to compress allowing some evaluation of the DUT nonlinearities.

Figure 2:
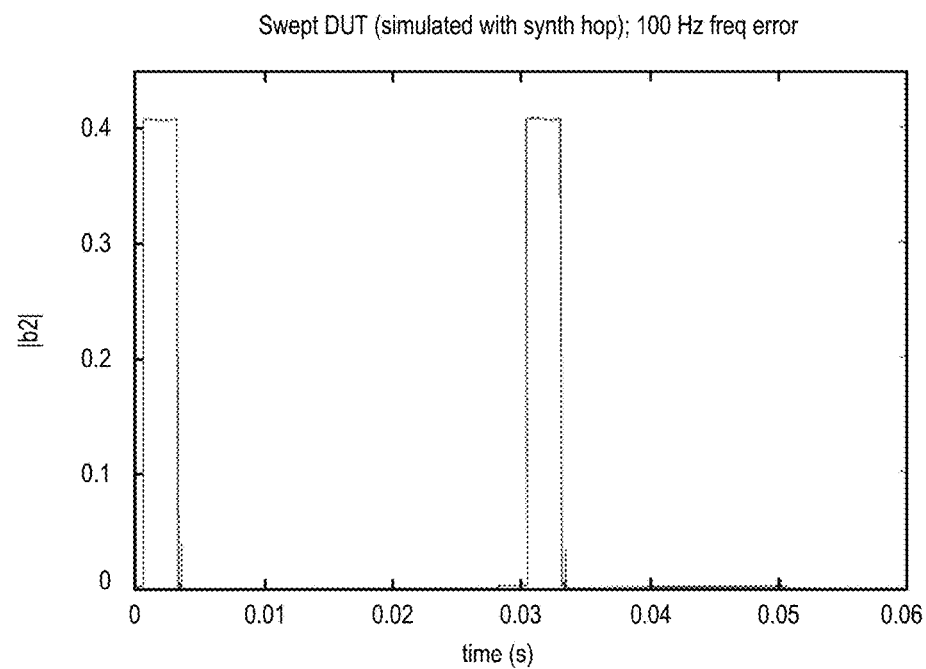
FIGS. 2 and 3 illustrate a plot of data collected for a two-point frequency sweep.
Figure 3:
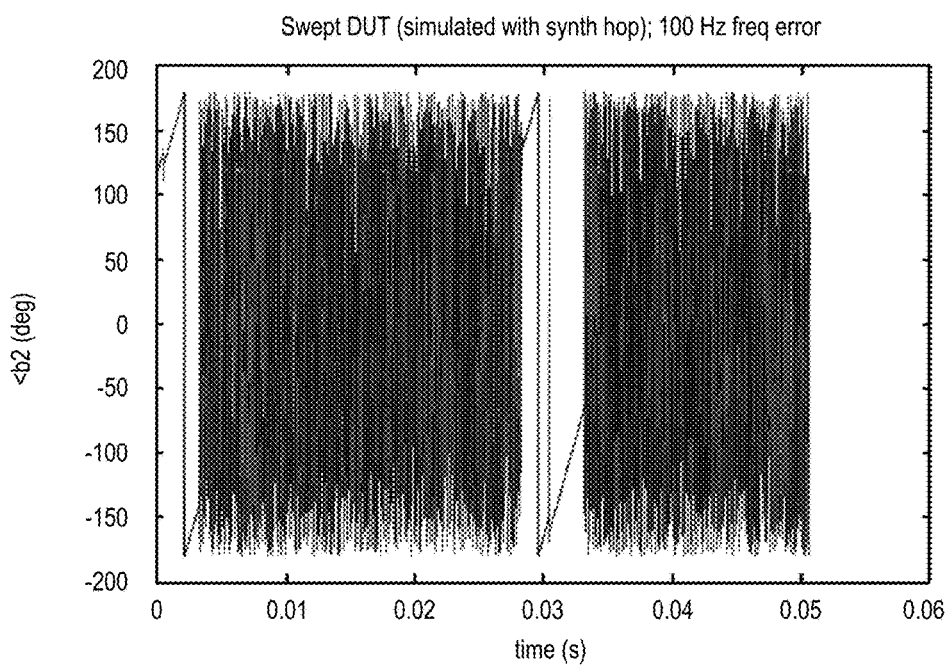

For embedded LO applications, systems and methods in accordance with embodiments can rely on capturing the phase of the DUT output at multiple frequencies so that group delay can be computed. Referring to FIGS. 2 and 3, data was collected for a 2 point frequency sweep (envelope and phase in the two successive plots). It is from this change in phase between frequency points that group delay can be computed. In some applications (e.g., a non-locked DUT LO in a frequency converting measurement), access to this phase variable is difficult and/or error-prone without a technique such as relied on by system and methods in accordance with embodiments.

In accordance with an embodiment, a system can comprise a measurement instrument including a non-transitory, computer readable medium having code for pulse application including data marking and triggering.

Figure 4:
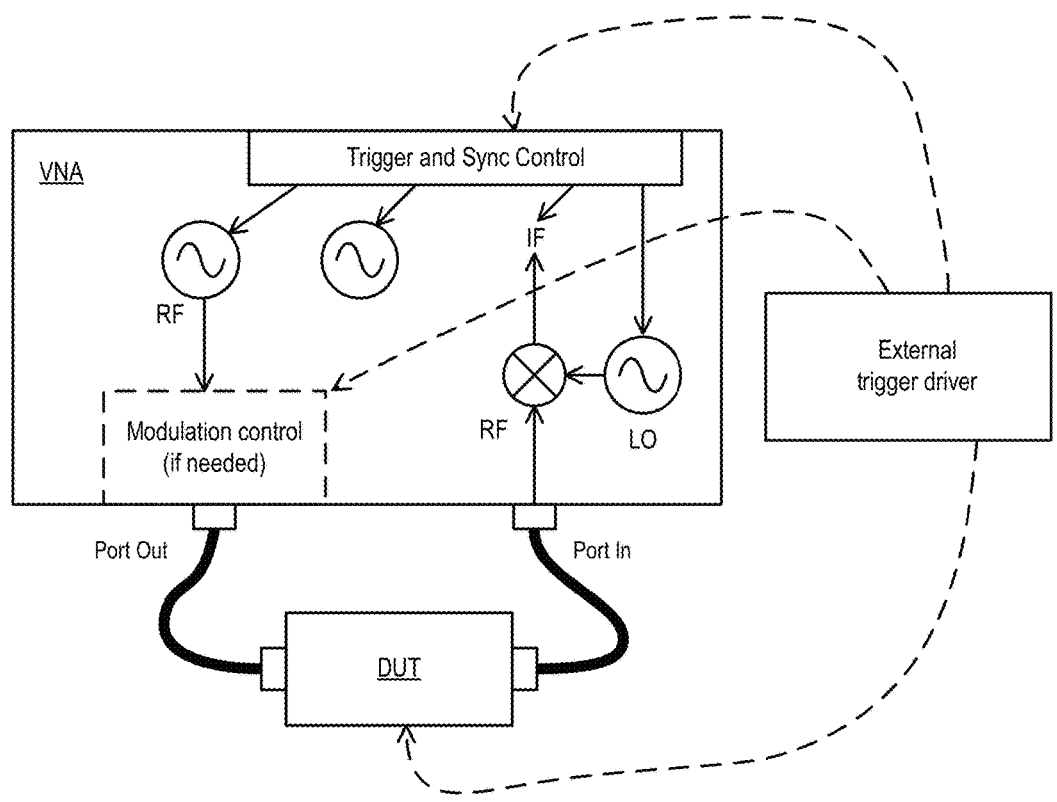
FIG. 4 is a high level measurement structure for a system for obtaining time-coherent transient network analyzer measurements, in accordance with an embodiment.

Referring to FIG. 4, a very basic, high-level measurement structure of a system in accordance with an embodiment is shown for improving the functionality of VNA measurements by allowing continuous acquisition of multiple channels of wideband data while frequency and/or power are swept. For this measurement there is a global measurement trigger and then point-by-point synchronization control. A device is stimulated at some starting time, often with some modulated signal, and the device turned on (or sent to an active state) at some related time, and the measurements recorded relative to those timing events.

Figure 5:
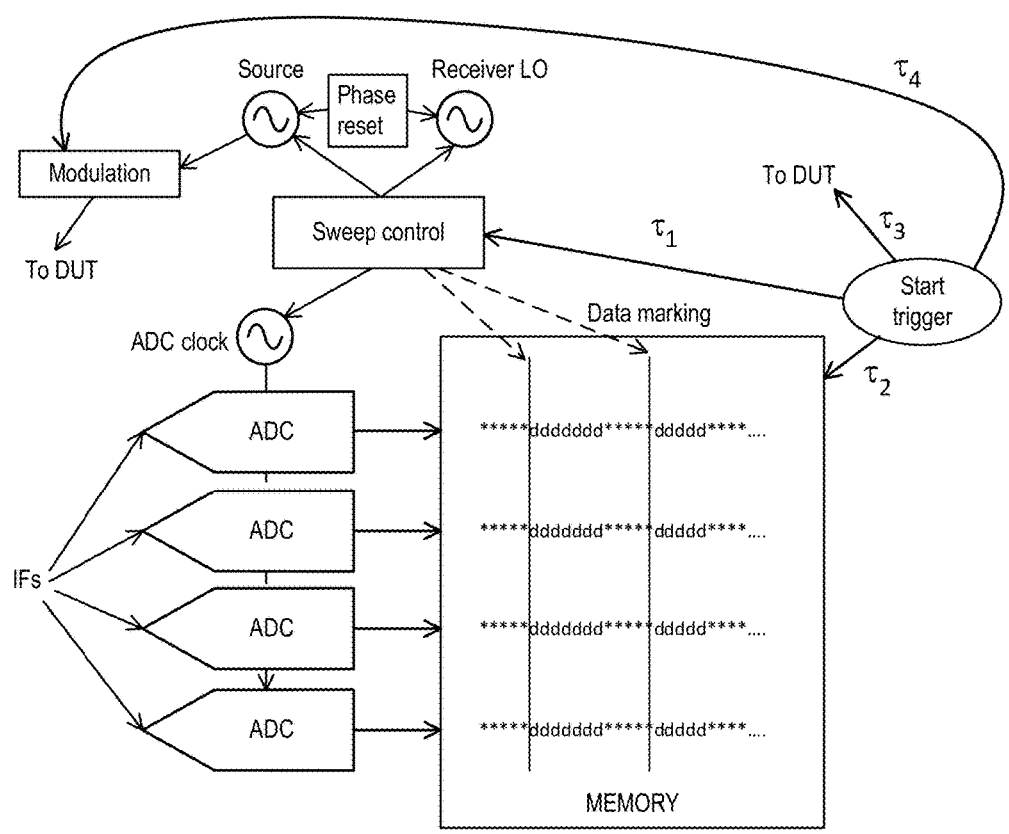
FIG. 5 is a more detailed view of a system for obtaining time-coherent transient network analyzer measurements, in accordance with an embodiment.

FIG. 5 is a more detailed view of a system in accordance with an embodiment for improving the functionality of VNA measurements by allowing continuous acquisition of multiple channels of wideband data while frequency and/or power are swept. As shown, the four ADCs correspond to a two-port VNA with an ADC for each of two test channels and an ADC for each of two reference channels. In other embodiments, additional test and reference channels can be synchronized, for example for a four, six or eight-port VNA.

The ADCs for all channels are recording continuous time records during a sweep of frequency and/or power. Having multiple gigabytes of memory allows relatively long sweep processes. The 'sweep control' moves the sources, LO and ADC clock to the appropriate locations over time and knows when they are in position. The sweep control knows when a new frequency is arrived at from a phase-lock loop (PLL) signal or leveling loop and a logical bit or other data mark can be embedded in the data stream from the ADC. Because the clocking into the memory is coherent, the data mark can be accurate to within one clock cycle. The sweep control engine places time-coherent marks in the live ADC data streams at each step in the sweep so that data is phase-aligned with the source hardware. Phase resets of the signal sources create absolute starting points for the timing.

In the example data stream shown stored in memory in FIG. 5, the vertical lines represent data marks, the 'd' symbols represents data corresponding to a sweep point and the '*'s represent (usually not useful) data occurring between sweep points. However, in some configurations or set-ups the system data corresponding to a sweep point will trail the data mark. For example, where a DUT is connected to a VNA by long cable runs. In such set-ups, the data corresponding to a sweep point can be identified by calculating the time difference between stimulus and response based on the configuration and identifying the data as lagging behind the data mark based on the calculation.

In many circumstances, the transients of interest will be associated with start-up events or some other event relative to a fixed time, for example where modulation is applied, the transients of interest may be associated with stimulus pulsing. In such circumstances, the trigger driver synchronizes the set-up (i.e., the VNA and DUT, and optionally modulation control). The trigger driver will therefore typically be external to the VNA. For example, the external trigger device could be a controller that activates a DUT, and which can be accessed to feed the activation signal to a VNA or other measurement instrument. However, in other embodiments, the trigger device can be an internal component of the VNA connected with the DUT. The triggering device need not be limited to those controllers associated specifically with the DUT or the VNA.

The external triggering process (to the DUT, to sweep control, to acquisition control and to modulation control (if needed)) could all have different latencies (marked as $\tau 1$, $\tau 2$, $\tau 3$ and $\tau 4$ in the figure). These latencies can be characterized to maintain overall time alignment. The latencies internal to the VNA (e.g., $\tau 1$ and $\tau 2$) will be consistent across set-ups with the DUT while the latencies to the DUT ($\tau 3$) needs to be characterized by the user based on the setup. The data marking coherence with the sources along with triggering coherence enables coherent measurements to be obtained.

The timing related to the modulation process can be relevant to the transient measurements as that timing (along with that of the trigger to the DUT) often plays a role in thermal evolution of the DUT. The time scales for the trigger and synch events vary widely depending on the application. For the present hardware, the fastest time between per point synch events is on the order of 10 μs. The minimum time resolution of the data record and marking is 2.5 ns but the acquisition rate can be as slow as 10 MHz. Depending on the number of frequency/power points in the sweep, the global start trigger rate (for the whole sweep) can be as fast as a few milliseconds although this is typically much slower when the measurement is one of thermal/trap transient analysis. The upper limit on the length of sweep is set only by memory and is typically hundreds to thousands of frequency/power points.

Memory requirements can vary based on the timescale that a user seeks to analyze. Embodiments of systems and methods can benefit from the use of "deep" memory as thermal time constants or power-on time constants can be on the scale of hundreds of microseconds to hundreds of milliseconds or longer, resulting in data requiring storage in the hundreds of megabytes to gigabytes for a frequency or power sweep.

In some embodiments, a sampling front-end allows harmonic sweeps without synchronization and can be exploited in some measurements. This can be used in concert with non-harmonic acquisition and marking.

Figure 6:
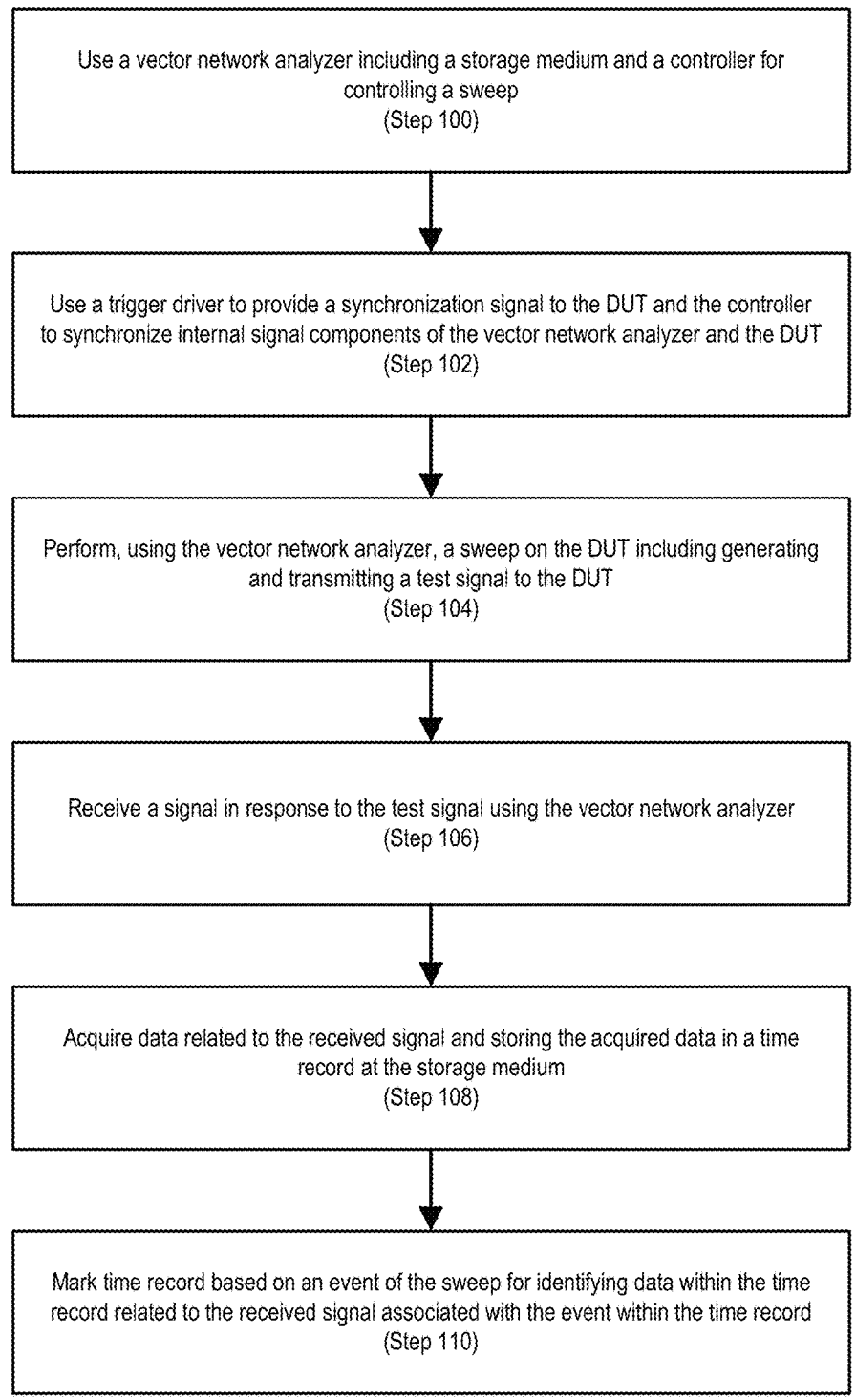
FIG. 6 is a flowchart for a method of obtaining measurements for a device under test (DUT) using a vector network analyzer (VNA), in accordance with an embodiment.

FIG. 6 is a flowchart of a method of obtaining measurements for a DUT using a VNA in accordance with an embodiment. A VNA is used that includes a storage medium and a controller for controlling a sweep (Step 100). The storage medium can include deep memory, e.g. memory comprising a gigabyte of capacity for each number of sweeps to be stored. A trigger driver can be used to provide a synchronization signal to the DUT and the controller to synchronize internal signal components of the vector network analyzer including signal sources, LOs and an ADC clock and the DUT (Step 102). A sweep is performed on the DUT using the VNA that includes generating and transmitting a test signal to the DUT (Step 104). A signal is received in response to the test signal using the VNA (Step 106) and data related to the received signal is acquired and stored in a time record at the storage medium (Step 108). The time record is marked based on an event of the sweep for identifying data within the time record related to the received signal associated with the event within the time record (Step 110).

In embodiments of methods such as shown in FIG. 6, the controller can be configured to initiate and perform a sweep of frequency or power independent of data acquisition, acquiring data continuously and for each step of the sweep. Marks can be inserted into the time record based on a change in step in the sweep for identifying the change in step within the time record. Where a pulsed test signal is used, each step in the sweep corresponds to an integer number of pulses of the pulsed test signal.

Harmonic Reconstruction Example

As a means of validation, the harmonic reconstruction of a DUT waveform is a possible vehicle. The data can be acquired in two ways for comparison. The data can be acquired in a single (non-swept, sampler-based) measurement where the harmonics (through 5th for this example) downconvert into the receiver into the harmonics of the IF (using harmonics of the LO). The base IF used in this case will be 30 MHz with the DUT output harmonic signatures appearing at 30, 60, 90, 120 and 150 MHz. Alternatively, the data can be acquired using a swept LO with the continuous acquisition process discussed and a fixed IF (100 MHz in this case). The harmonic responses in the IF system are not analyzed in this case and the measurement relies on the repeatable phase relationship of the LO and ADC clock during the various receiver positions.

Figure 7:
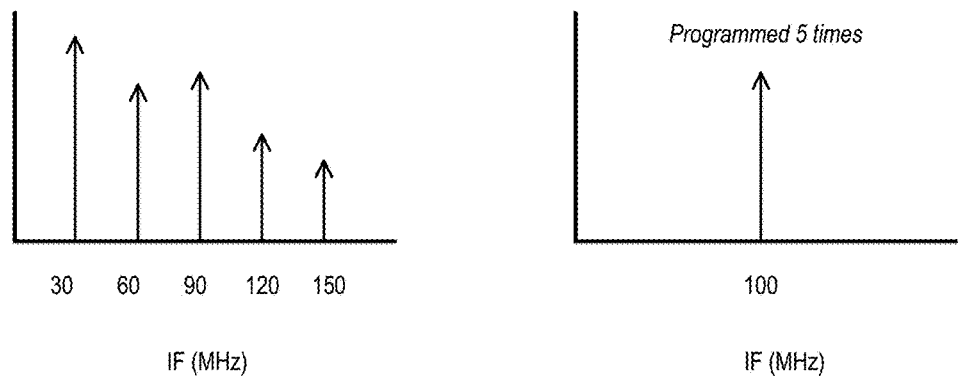
FIG. 7 illustrates two measurement protocols comprising a continuous acquisition method in accordance with an embodiment and a standard technique for converting DUT harmonics to harmonics of an intermediate frequency (IF) of a system in accordance an embodiment.

For both measurements, a harmonic phase calibration is required to correct for receiver phase variation as usual but the difference is in the reprogramming of the receiver LO between measurements. Classically, a level of ratioing was normally employed to remove phase scrambling in that process. The intent here is to show that through continuous acquisition and enough internal synchronization, that the same result can be achieved as with a single measurement. Schematically, the two measurements are illustrated in FIG. 7, in receiver IF space. On the left, harmonics of a single LO are used to convert DUT harmonics to harmonics of the system IF. On the right, in continuous acquisition mode, the receiver is sequentially programmed to the harmonic locations.

Figure 8:
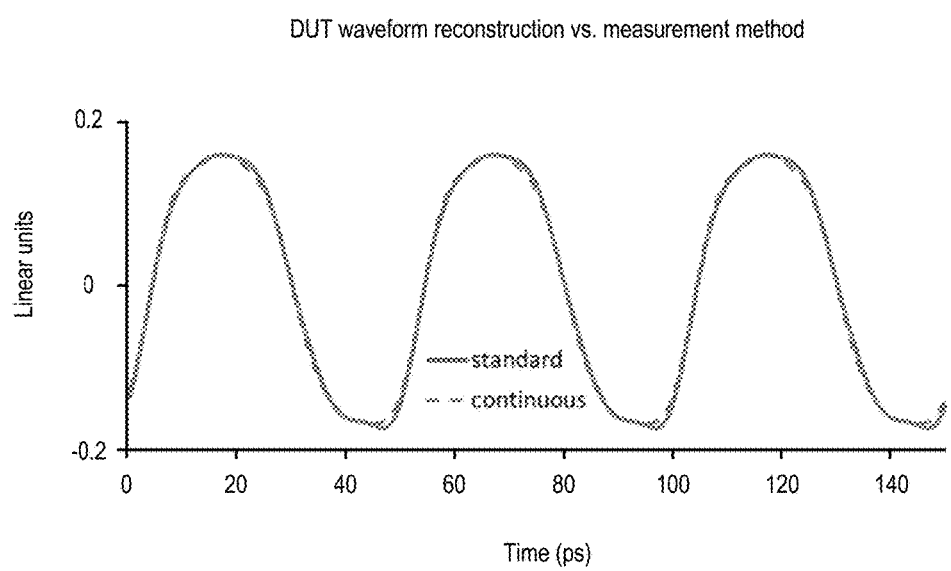
FIG. 8 illustrates reconstructed DUT output waveforms using the continuous acquisition method and the standard technique.

The two reconstructed waveforms for a 20 GHz input stimulus (so harmonics to 100 GHz are used) are shown in FIG. 8. The reconstructed DUT output waveforms using the continuous acquisition approach and a standard, swept receiver approach are plotted here to show approximate equivalency. Harmonic phase calibration errors are common to both extractions so that does not enter into the comparison. This is more a measure of distortions introduced by the sweep process in the continuous acquisition case. The maximum difference on the time waveform reconstruction is about 5% at the peaks.

Perhaps more useful are the differences in terms of the complex harmonic amplitudes. These ranged were <0.2 dB/<3.5 degrees through the 3rd harmonic (<0.55 dB/<10 degrees through the 5th). This provides some level of validation of the swept approach and perhaps allows the methods to be used in concert.

Measurements

A measurement of interest for an embodiment of a method comprising continuous acquisition includes that of start-up transient interrogation where a sweep of some variable accompanies the start process. If the start process also involves the beginning of some modulation envelope and DUT state, the complexities increase even on a scalar level. In this case, however, phase evolution is also important as it may be for any number of modeling, phased array, and radar application.

The first measurement is a pulsed power sweep at 60 GHz of a moderate power amplifier and the primary parameter of interest is AM/PM of a modulation sideband (i.e., phase deviation versus power) starting from a cold state. The DUT is pulsed, in this case with a 1 ms period and a 20 µs width. On every pulse from start, a different power is to be applied ranging from −25 dBm to 0 dBm in a total of 35 steps (i.e., 35 pulses). Because the thermal evolution from start is of interest, it is important that the power change by the determined amount on every pulse and that no pulses be skipped.

A classical approach would be to start the pulse generator and DUT running at initial trigger and start the measurements at the same time but allow the measurement sweep to proceed asynchronously. In this 'standard' method, typically multiple pulses hit the DUT at each of the given power steps, although in some configurations it is possible that the DUT misses power steps, depending on the length and period of pulses. For such configurations acquisition is incomplete.

Figure 9:
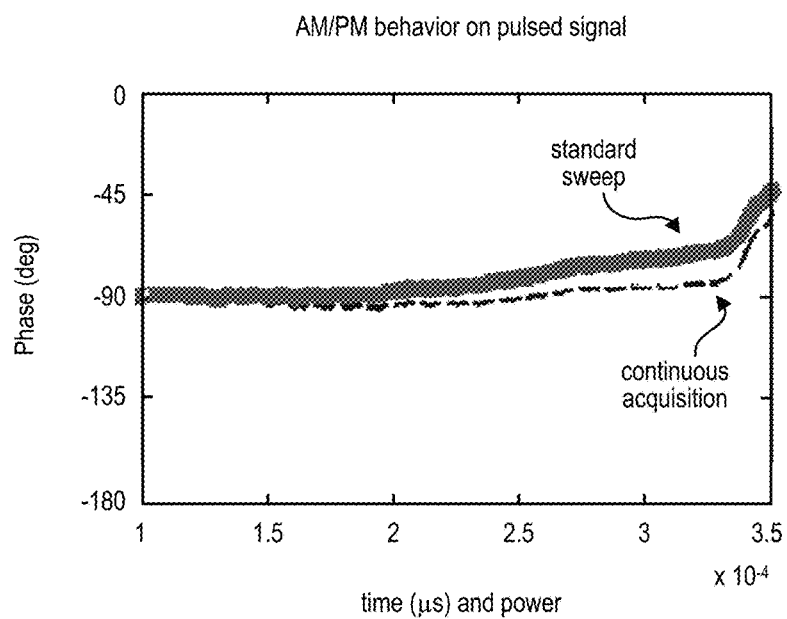
FIG. 9 illustrates amplitude modulation/phase modulation (AM/PM) measurements of a sideband from cold start of a 60 GHz DUT using the continuous acquisition method and the standard technique.

The results comparing the continuous approach with the standard classical approach are plotted in FIG. 9, which shows AM/PM measurements of a sideband from cold start of a 60 GHz DUT. The x-axis in this plot is listed in time (up to 35 ms) but equivalently converts to input power with the maximum value of 0 dBm. The linear value of the phase shift through the DUT at this frequency is about −90 degrees. In the continuous method, there is less than a few degrees of AM/PM up until the 33rd pulse/step where a sharp increase occurs. With the standard approach, more AM/PM is noted at lower power levels with a softer transition when the higher levels are reached. It is believed that this is due to accumulated thermal load on the DUT from multiple pulses (average 4) at each of the power levels. This thermal history propagates into the AM/PM plot and may misrepresent the DUT behavior under its intended operating conditions. From single-shot measurements at the 30th pulse, it was believed that the AM/PM should be less than 2 degrees which does not agree with the standard method.

Figure 10:
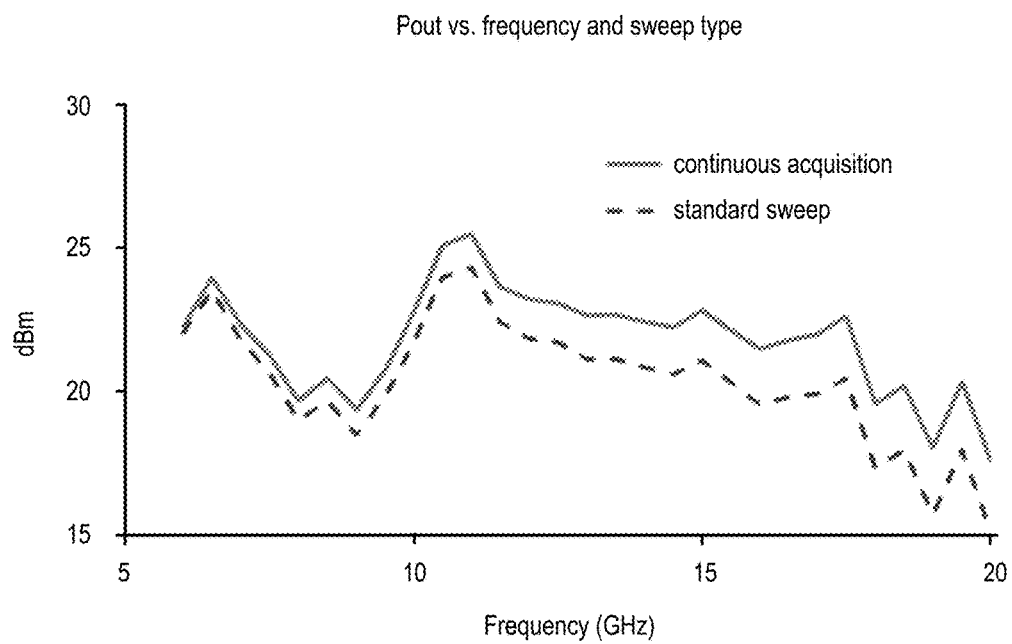
FIG. 10 illustrates the power output responses of a thermally sensitive device triggered from cold start using the continuous acquisition method and the standard technique.

Referring to FIG. 10, a second measurement case is that of a frequency sweep from 6 to 20 GHz (31 points) of a power amplifier where output power and harmonic phase are of interest. The graph plots the power output responses of a thermally sensitive device using embodiments of methods applying continuous acquisition and a standard technique where there is little coordination between the modulation and sweep timing. Both measurements were triggered from a cold start.

In this example, the envelope is not classically pulsed but only has ~15 dB attenuation during quasi-off-states. The frequency changes between each on-state from the cold start event and each frequency propagates to the DUT during precisely one on-state. At the lower frequencies (immediately after the cold start), there is only ~0.1 dB difference between the continuous acquisition and the standard technique but this increases to over 2 dB by the last frequency. In the standard technique, the DUT sees each frequency for 3-4 on-states so it is again believed that the thermal load through the measurement accumulates and reduces the gain and output power of the device below what occurs with the intended protocol. The DUT temperature at the end of the measurement was ~2° C. higher with the standard technique compared with continuous acquisition, with both starting from the same cold point. If the DUT is left running for several minutes prior to measurement, the traces for the standard technique and the continuous acquisition overlay each other.

Figure 11:
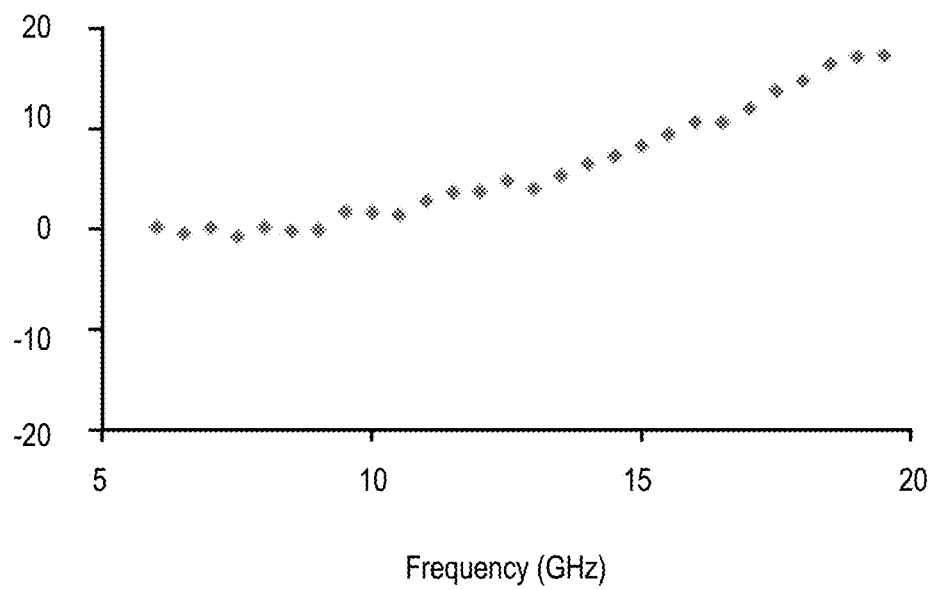
FIG. 11 illustrates the difference in phase delays measured using the continuous acquisition method and the standard technique and plotted in FIG. 10.

The second harmonic phase difference (between the two methods) is plotted in FIG. 11 and also shows an evolution from near zero difference at earlier points to over 15 degrees at the highest frequency. The same thermal load mechanism would seem to explain this result. Again, this particularly measurement is exploring both synchronization on a basic harmonic phase level but timing coherence of the sweep and DUT excitation as well.

Systems and methods in accordance with embodiments can be applied to obtain phase/time-coherent swept VNA measurements, with hardware and configuration simplification by managing triggering, synchronization, and the live data stream from the measuring receiver. This type of measurement, and simplification of it, has been shown to be useful in measurements such as swept transient analysis of timing-sensitive devices and subsystems.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMS, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A system for obtaining measurements for a device under test (DUT) comprising:
a vector network analyzer including a storage medium and a controller for controlling a sweep;
a trigger driver configured to provide a synchronization signal to the controller to synchronize internal signal components of the vector network analyzer including signal sources, local oscillators (LOs) and an analog-to-digital converter (ADC) clock;
wherein the trigger driver further synchronizes the DUT and the vector network analyzer;
wherein when the vector network analyzer generates and transmits a test signal to the DUT, a signal is received by the vector network analyzer in response to the test signal and data related to the received signal is acquired and stored in a time record at the storage medium;
wherein the controller inserts a mark into the time record based on an event of the sweep for identifying acquired data related to the received signal associated with the event within the time record.

2. The system of claim 1, wherein the trigger driver is external to the vector network analyzer and the synchronization signal is provided to the vector network analyzer.

3. The system of claim 2, wherein the trigger driver is associated with the DUT and activates or otherwise initiates an action of the DUT.

4. The system of claim 1, wherein the trigger driver is a component of the vector network analyzer.

5. The system of claim 1, wherein synchronizing internal components of vector network analyzer and the DUT, including synchronizing, via the controller, signals sources, LOs, and an ADC clock of the vector network analyzer includes adjusting timing based on the synchronization signal and latencies to each of the internal components and to the DUT.

6. The system of claim 1, wherein the controller is configured to initiate and perform a sweep of frequency or power independent of data acquisition and wherein the data is acquired continuously and for each step of the sweep.

7. The system of claim 6, wherein the controller inserts the mark into the time record based on a change in step in the sweep for identifying the change in step within the time record.

8. The system of claim 7, wherein the test signal is a pulsed test signal and wherein each step in the sweep corresponds to an integer number of pulses of the pulsed test signal.

9. A method of obtaining measurements for a device under test (DUT) using a vector network analyzer (VNA), comprising:
using a vector network analyzer including a storage medium and a controller for controlling a sweep;
using a trigger driver to provide a synchronization signal to the DUT and the controller to synchronize internal signal components of the vector network analyzer including signal sources, local oscillators (LOs) and an analog-to-digital converter (ADC) clock and the DUT;
performing, using the VNA, a sweep on the DUT including generating and transmitting a test signal to the DUT;
receiving a signal in response to the test signal using the vector network analyzer;
acquiring data related to the received signal and storing the acquired data in a time record at the storage medium; and
marking the time record based on an event of the sweep for identifying data within the time record related to the received signal associated with the event within the time record.

10. The method of claim 9, wherein the trigger driver is external to the vector network analyzer and the synchronization signal is provided to the vector network analyzer.

11. The method of claim 10, wherein the trigger driver is associated with the DUT and activates or otherwise initiates an action of the DUT.

12. The method of claim 9, wherein the trigger driver is a component of the vector network analyzer.

13. The method of claim 9, wherein synchronizing internal components of vector network analyzer and the DUT, including synchronizing, via the controller, signals sources, LOs, and an ADC clock of the vector network analyzer includes adjusting timing based on the synchronization signal and latencies to each of the internal components and to the DUT.

14. The method of claim 9, wherein the controller is configured to initiate and perform a sweep of frequency or power independent of data acquisition and wherein the data is acquired continuously and for each step of the sweep.

15. The system of claim 14, wherein the controller inserts the mark into the time record based on a change in step in the sweep for identifying the change in step within the time record.

16. The system of claim 15, wherein the test signal is a pulsed test signal and wherein each step in the sweep corresponds to an integer number of pulses of the pulsed test signal.

17. A non-transitory computer readable storage medium having instructions thereon that when read by one or more processors causes the processors to perform the steps comprising:
  using a vector network analyzer including a storage medium and a controller for controlling a sweep;
  using a trigger driver to provide a synchronization signal to the DUT and the controller to synchronize internal signal components of the vector network analyzer including signal sources, local oscillators (LOs) and an analog-to-digital converter (ADC) clock and the DUT;
  performing, using the VNA, a sweep on the DUT including generating and transmitting a test signal to the DUT;
  receiving a signal in response to the test signal using the vector network analyzer;
  acquiring data related to the received signal and storing the acquired data in a time record at the storage medium; and
  marking the time record based on an event of the sweep for identifying data within the time record related to the response signal associated with the event within the time record.

18. The non-transitory computer readable storage medium of claim 17, having instructions thereon that when read by one or more processors causes the processors to perform the further steps comprising:
  synchronizing internal components of vector network analyzer and the DUT, including synchronizing, via the controller, signals sources, LOs, and an ADC clock of the vector network analyzer by adjusting timing based on the synchronization signal and latencies to each of the internal components and to the DUT.

19. The non-transitory computer readable storage medium of claim 17, having instructions thereon that when read by one or more processors causes the processors to perform the further steps comprising:
  initiating and performing a sweep of frequency or power independent of data acquisition and wherein the data is acquired continuously and for each step of the sweep.

20. The non-transitory computer readable storage medium of claim 19, having instructions thereon that when read by one or more processors causes the processors to perform the further steps comprising:
  inserting the mark into the time record based on a change in step in the sweep for identifying the change in step within the time record; and
  generating a pulsed test signal, wherein each step in the sweep corresponds to an integer number of pulses of the pulsed test signal.

* * * * *